United States Patent
Kitson

(10) Patent No.: US 10,012,904 B2
(45) Date of Patent: Jul. 3, 2018

(54) LITHOGRAPHIC PRINTING PLATE PRECURSORS AND COATING

(71) Applicant: Anocoil Corporation, Rockville, CT (US)

(72) Inventor: Anthony Paul Kitson, West Suffield, CT (US)

(73) Assignee: Mark'Andy Inc., Chesterfield, MO (US)

( * ) Notice: Subject to any disclaimer, the term of this patent is extended or adjusted under 35 U.S.C. 154(b) by 0 days.

(21) Appl. No.: 15/033,198

(22) PCT Filed: Oct. 24, 2014

(86) PCT No.: PCT/US2014/062081
§ 371 (c)(1),
(2) Date: Apr. 29, 2016

(87) PCT Pub. No.: WO2015/065816
PCT Pub. Date: May 7, 2015

(65) Prior Publication Data
US 2016/0252813 A1     Sep. 1, 2016

Related U.S. Application Data

(60) Provisional application No. 61/897,331, filed on Oct. 30, 2013.

(51) Int. Cl.
| | | |
|---|---|---|
| *G03F 7/00* | (2006.01) | |
| *G03F 7/075* | (2006.01) | |
| *G03F 7/032* | (2006.01) | |
| *G03F 7/027* | (2006.01) | |
| *G03F 7/038* | (2006.01) | |
| *G03F 7/085* | (2006.01) | |
| *G03F 7/32* | (2006.01) | |
| *G03F 7/20* | (2006.01) | |

(52) U.S. Cl.
CPC ............ *G03F 7/0755* (2013.01); *G03F 7/027* (2013.01); *G03F 7/032* (2013.01); *G03F 7/038* (2013.01); *G03F 7/0751* (2013.01); *G03F 7/085* (2013.01); *G03F 7/2002* (2013.01); *G03F 7/322* (2013.01)

(58) Field of Classification Search
CPC .................................................... G03F 7/085
See application file for complete search history.

(56) References Cited

U.S. PATENT DOCUMENTS

| | | | |
|---|---|---|---|
| 6,433,046 B1 * | 8/2002 | Campbell | C08K 5/0066 524/100 |
| 8,187,791 B2 | 5/2012 | Sonokawa et al. | |
| 8,338,507 B2 * | 12/2012 | Hierse | C08F 2/20 524/130 |
| 2005/0208423 A1 | 9/2005 | Mitsumoto et al. | |
| 2007/0010619 A1 * | 1/2007 | Chatterjee | C08G 64/12 525/67 |
| 2010/0209851 A1 * | 8/2010 | Williamson | B41C 1/1008 430/302 |
| 2012/0003484 A1 * | 1/2012 | Roehrig | B05D 1/60 428/447 |
| 2012/0160118 A1 | 6/2012 | Oohashi et al. | |
| 2012/0183901 A1 | 7/2012 | Mori et al. | |

FOREIGN PATENT DOCUMENTS

| | | | | |
|---|---|---|---|---|
| WO | 2011092278 A1 | 8/2011 | | |
| WO | WO 2011092278 A1 * | 8/2011 | ............. | C09D 5/086 |
| WO | 2013009372 A1 | 1/2013 | | |
| WO | WO 2013009372 A1 * | 1/2013 | ......... | C08G 18/4829 |
| WO | 2013134380 A1 | 9/2013 | | |
| WO | WO 2013134380 A1 * | 9/2013 | ........... | B41C 1/1008 |

OTHER PUBLICATIONS

International Search Report and Written Opinion dated Dec. 16, 2014 (PCT/US2014/062081).

* cited by examiner

*Primary Examiner* — Chanceity Robinson
(74) *Attorney, Agent, or Firm* — Banner & Witcoff, Ltd.

(57) ABSTRACT

A coating for use with a hydrophilic sheet substrate to form a lithographic printing plate precursor, including at least one Compound A silane compound and at least one Compound B phosphinic acid or organic derivative thereof. Compounds A and B experience a synergistic interaction which substantially increases adhesion to the substrate of areas imaged by radiation. The resulting plate is exhibits high on-press durability suitable for high volume commercial uses without a preheat step prior to development, even when imaged with lower levels of radiation such as violet lasers. A method of preparing a lithographic printing plate includes imagewise exposing the coating on a surface of a hydrophilic substrate to violet radiation and developing in an alkaline aqueous solution without preheating.

14 Claims, No Drawings

LITHOGRAPHIC PRINTING PLATE PRECURSORS AND COATING

BACKGROUND

The invention disclosed herein relates to lithographic printing plates. Plates of interest commonly have a solvent-soluble, radiation-polymerizable, oleophilic resin coating on a hydrophilic substrate. In conventional practice, after image-wise exposure at ultraviolet (UV), visible (violet), or infrared (IR) wavelengths, the plates are developed with solvent to remove the unexposed areas of the coating by dissolution, thereby producing a substantially planographic pattern of oleophilic and hydrophilic areas. The developed plates are then ready for mounting on a cylinder of a printing press, where the plates are subjected to fountain fluid and ink for transfer of ink to a target surface according to the pattern of oleophilic and hydrophilic areas on the plate. Lithography is operates on the fundamental principle that oil and water are immiscible.

In modern offset printing, a photosensitive coating is typically applied to an anodized aluminum sheet to produce a printing plate. An imagewise exposure of the photosensitive coating to radiation initiates photopolymerization in the image areas, and consequently an image on the surface of the plate. On a printing press, ink is attracted to the imaged portions of the coating and the water (i.e., aqueous fountain solution) is attracted to the non-imaged plate surface, which is often anodized aluminum. The ink is subsequently transferred from the imaged areas of the plate to a rubber blanket sleeve, and then to the print medium to produce the printed product.

Digitization of the imaging process has increased in recent years, resulting in simplification and improvement in image quality. Images are typically transmitted digitally from computer to the plate surface by means of laser direct imaging. Laser direct imaging devices have been commercialized with ultra-violet, visible, and infrared laser. Of these, infrared (830 nm) and violet (405 nm) have received the most commercial acceptance for the imaging of printing plates.

Infrared is often considered to offer the highest quality image reproduction, and also allows plates to be prepared in a white light working environment. However, infrared imaging devices are costly to purchase and maintain, typically requiring replacement of high powered laser heads after as few as 3000 working hours.

Violet imaging provides high quality reproduction in a bright yellow light working environment. Compared to infrared equipment, violet imaging equipment is relatively inexpensive to purchase and maintain and provides a high level of productivity. A violet laser may last up to as many as 10,000 working hours, and replacement costs are relatively low. Violet imaging equipment has improved to the point where resolutions in excess of 200 lines per inch are possible, and imaging limitations are more attributable to the photosensitive plates rather than the exposure equipment.

Thermally imageable plates are commercially available, which require no pre-heat step prior to development. These plates usually have relatively low resolution and short press lives. The main reason for this is that they need more imaging exposure energy in order to gain integrity for the image. When an image is created in this manner it causes the "dots" or pixels that form the image to gain surface area. This phenomenon is called "dot gain" and causes degradation in the resolution of the plate.

As an alternative, the plate can be exposed at lower imaging energy and then pre-heated before development, but "dot gain" still often occurs. However, in this case it is the excess energy of the heater that causes the "dot gain". This energy (in the form of heat) forces the polymerization to continue not only in the center of the dots (which is needed for longer press life) but it also causes the dots to grow out from the edges.

The energy available for plates exposed with infrared laser radiation is in the order of 50 to 200 $mJ/cm^2$, approximately 1000 times greater than a violet laser output. It is possible to produce photopolymerizable compositions for infrared imaging, which do not require a "pre-heat" step, a heating process used to enhance the image prior to development processing. For example, photoinititor compositions capable of producing such an image without the pre-heat exist which substantially simplify plate processing. Plates capable of development in simple one-bath processors through environmentally friendly developers are available, as are plates that develop directly on press in the ink and fount train.

There are known advantages to imaging coatings sensitive to violet and ultra-violet (UV) energy. However, a common disadvantage to violet imagine arises because typical imaging equipment cannot generate high intensity beams, so preheating after imaging is often required, thereby adding complexity to the production process.

Plates imaged by visible violet radiation are exposed with energies ranging from 50 to 200 $\mu J/cm^2$. The amount of energy is relatively low and considered insufficient to fully polymerize the image. A post-exposure pre-heating step is typically required to harden the image and improve durability and adhesion to the substrate to commercially acceptable levels. Processing with a pre-heat step necessarily adds complexity to the production process by requiring processors equipped with ovens, which increases overall cost of production and maintenance often to the level of offsetting the advantages of using violet imaging equipment over infrared, or other common techniques. Variability of temperature can impact image resolution and durability, thereby the quality of the printed product. Furthermore, due to the pre-heating requirement, known violet plates cannot be developed through simple one-bath processors or directly on press. For these reasons, plates exposed by violet laser are often utilized in lower quality printing environments such as newsprint.

Attempts have been made to produce violet plates which do not require preheat, including processes of producing an image by writing with a violet laser, then maintaining the plate at ambient conditions for at least 2.5 minutes to enhance polymerization and harden the image prior to processing. Such an approach is inconvenient for existing, fast paced, automated production environments and has been known to yield an image with sufficient on-press durability.

Regardless of how plate manufacturers and end users make the tradeoff between infrared and violet imaging techniques and plates, in conventional solvent based development of negative, actinically imageable lithographic plates, no substantial further cross-linking can be achieved in the image areas after development of the plate in solvent. Any coating material in the image areas that did not react with the radiation, is dissolved and therefore removed from the image areas during the development step.

There remains a need for photopolymer printing plates with improved durability on press, especially when the pre-heat step is eliminated during the development process.

In particular, there remains a need for photopolymer printing plates exposed by visible violet laser with improved durability on press, especially when plates are not subject to a pre-heat step.

SUMMARY

Disclosed herein is a photopolymer coating comprising an initiator composition capable of generating free radicals, a free radically polymerizable component, a binder, and at least one of each class of Compounds A and B, which have been found to increase adhesion to the substrate (i.e. plate) of violet imaged areas substantially:

Compound A is a silane compound having the structure,

wherein X is a hydrolysable group such as an alkoxy, acyloxy, halogen or amino group, and R is an organic group.

Compound B is a phosphorous oxoacid, or organic derivative thereof, including salts thereof, having one of structures I-IV,

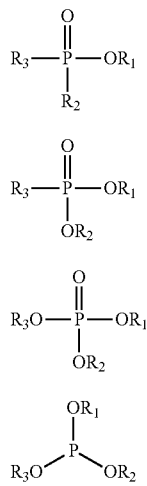

Compound I is a phosphinic acid or organic derivative thereof, including a salt thereof; Compound II is a phosphonic acid or organic derivative thereof, including a salt thereof; Compound III is a phosphoric acid or organic derivative thereof, including a salt thereof; and Compound IV is a phosphite.

As shown in the herein examples, a synergistic interaction between Compounds of classes A and B has been discovered. The synergy produced a significant an unexpected increase in adhesion between the photopolymerized image and the substrate. Use of only one of Compound A or Compound B in the photopolymerizable composition results in adhesion losses with any imaging radiation source, and printing plates that were not suitable for lithographic printing when a violet laser was used for imaging. Conversely, inclusion of both Compounds A and B resulted in photosensitive compositions capable of being imaged effectively without a pre-heating step, even when exposed to a violet laser having relatively lower energy compared to infrared. The disclosed photopolymer coating provides a plate for lithographic printing with enhanced on-press durability, without the requirement for a step of pre-heating the plate, even when imaged with a relatively low energy output provided by violet laser. Embodiments of the coating and plate may also be developed in a single tank bath of an aqueous alkaline solution, thereby enhancing efficiency.

DETAILED DESCRIPTION

The photopolymerizable composition described herein is particularly useful for low energy applications, in particular violet laser direct imaging at, for example, a wavelength of around 405 nm. However, the improved durability and high adhesiveness can of course be achieved at other exposure wavelengths. Accordingly, the composition is also useful in processes of imaging with UV, visible and infrared radiation.

Although the disclosure and associated data relate primarily to offset lithography, the principles of the compositions described herein can be applied to any other lithographic or coating applications, examples of which include manufacture of printed circuit boards, thin film transistors, liquid crystal displays, plasma display panels, color filters, surface coatings for metals, and the like.

The disclosed photopolymer coating includes an initiator composition capable of generating free radicals, a free radically polymerizable component, a binder, and at least one compound of each of the classes of A and B (described in greater detail below).

The initiator composition capable of generating free radicals may be a combination of several compounds. Numerous initiators and initiator compositions are known to those skilled in the art. The numerous compounds known to take part in the photoiniation of free radicals include, without limitation, aromatic carbonyl compounds such as acetophenone, benzophenone, aromatic hydroxyl ketones such as benzoin, alpha-keto esters and azo compounds such as azo bis-isobutyronitrile and diazirine, N-phenylglycine and derivatives, N-aryl, S-aryl or O-aryl polycarboxylic acid coinitiators, mercapto compounds such as 2-mercaptobenzimadazole and 3-mercpato-1,2,4-benzotriazole, acyl phosphine oxides and sulfides. Other useful initiator compounds include trihalomethyl triazines, borate salts including alkyltriarylborate salts and tetraarylborate salts and onium salts, for example, diazonium salts, iodonium salts, sulfonium salts, phosphonium salts, and pyridinium salts; and mixtures thereof.

Titanium compounds having a dicyclopentadienyl structure and a biphenyl structure, such as dicyclopentadienyl titanium dichloride, dicyclopentadienyl titanium bisphenyl, dicyclopentadienyltitanium bis(2,4-difluorophenyl), dicyclopentadienyl titanium bis(2,6-difluorophenyl), dicyclopentadienyl titanium bis(2,4,6-trifluorophenyl), dicyclopentadienyl titanium bis(2,3,5,6-tetrafluorophenyl), dicyclopentadienyl titanium bis(2,3,4,5,6-pentafluorophenyl), di(methylcyclopentadienyl) titanium bis(2,6-difluorophenyl), di(methylcyclopentadienyl) titanium bis(2,3,4,5,6-pentafluorophenyl), and dicyclopentadienyl titanium bis[2,6-difluoro-3-(1-pyrrolyl)phenyl] are of particular interest for use in the disclosed coating.

Additionally, 2,4,5-triarylimidazolyl dimers (hexaarylbiimidazoles, or HABIs) such as are disclosed in U.S. Pat. No. 4,565,769 (Dueber et al) have been shown to be particularly effective. Upon exposure to light excitation energy HABIs readily cleave to form 2,4,5-triarylimidazolyl radicals, which initiate polymerization of ethylenically unsaturated materials. Examples of suitable HABI compounds include 2,2'-bis(2-chlorophenyl)-4,4',5,5'-tetraphenylbisimidazole, 2,2'-bis (2-ethoxyphenyl)-4,4',5,5'-tetraphenyl 1,1'-biimidazole, 2,2'-bis(2-chlorophenyl)-4,4',5,5'-tetra(3-methoxyphenyl)biimidazole, 2,2'-bis(2-chlorophenyl)-4,4',5,5'-tetra(4-methoxyphenyl)biimidazole, 2,2'-bis(2-chlorophenyl)-4,4', 5,5'-tetra(4-methylphenyl) biimidazole, 2,2'-bis(2-chlorophenyl)-4,4',5,5'-tetra(p-ethoxycarbonylphenyl) biimidazole, 2,2'-bis(2-chlorophenyl)-4,4',5,5'-tetra(4-fluorophenyl)biimidazole, 2,2'-bis(2-bromophenyl)-4,4',5, 5'-tetra(p-iodophenyl)biimidazole, 2,2'-bis(2-chlorophenyl)-4,4',5,5'-tetra(4-chloronaphthyl)biimidazole, 2,2'-bis(2-chlorophenyl)-4,4',5,5'-tetra(4-chlorophenyl)biimidazole, 2,2',4,4'-tris(2-chlorophenyl)-5-(3,4-dimethoxyphenyl)-4', 5'-diphenyl biimidazole, and 2,2',4,4'-bis(2-chlorophenyl)-5,5'-bis(3,4-dimethoxyphenyl) biimidazole. Of these compounds, 2,2'-bis(2-chlorophenyl)-4,4',5,5'-tetraphenylbisimidazole, 2,2'-bis(2-chlorophenyl)-4,4',5,5'-tetra(3-methoxyphenyl)biimidazole are particularly preferred.

In cases where the materials described above do not react sufficiently for a desired use, a sensitizing agent may be added. Sensitizing agents are selected to absorb energy at a wavelength matched to the incident radiation. The sensitizer absorbs the radiation and the co-initiator receives the light excitation energy to generate free radicals. Sensitizers with a high extinction coefficient at the wavelength of the incident radiation are typically preferred. Examples of suitable sensitizers include, without limitation, coumarins, 3-substituted coumarins, benzophenone derivatives such as Michler's ketone, camphorquinone, thioxanthones, fluoresceins, xanthenes, methine, polymethine, arylmethine, cyanine, hemicyanine, streptocyanine, indocyanine, indotricarbocyanine, oxatricarbocyanine, phthalocyanine, thiocyanine, thiatricarbocyanine, merocyanine, cryptocyanine, naphthalocyanine, squarylium, pyrylium, oxonol, naphthoquinone, anthraquinone, porphyrin, azo, croconium, triarylamine, thiazolium, indolium, oxazolium, polyaniline, polypyrrole, polythiophene, chalcogenopyryloarylidene and bis (chalcogenopyrylo)polymethine, oxyindolizine, pyrazoline azo, and oxazines and the like. Sensitizers suitable specifically for absorbing violet or infrared radiation are known in the field.

The free radically polymerizable component of the disclosed coating or plate precursor includes at least one ethylenically unsaturated group capable of undergoing addition polymerization by the action of the irradiated initiator composition. Such materials include ethylenically unsaturated monomers, oligomers and polymers. Examples of such monomers include unsaturated carboxylic acids, such as (meth)acrylic acid, itaconic acid, crotonic acid, isocrotonic acid, styrene, (meth)acrylonitrile, (meth)acrylamide, (meth)acrylic esters such as methyl (meth)acrylate, ethyl (meth)acrylate, butyl (meth)acrylate, hydroxyethyl (meth)acrylate, hydroxypropyl(meth)acrylate, and the like.

Useful polyfunctional acrylic monomers include pentaerythritol di(meth)acrylate, ethyleneglycol di(meth)acrylate, polyethyleneglycol di(meth)acrylate, glycerol di(meth)acrylate, 1,3-butandediol di(meth)acrylate, 1,6-hexanediol di(meth)acrylate, bisphenolA di(meth)acrylate, bisphenolA ethoxylate di(meth)acrylate neopentylglycol di(meth)acrylate, trimethylolpropane tri(meth)acrylate, pentaerythritol tri(meth)acrylate, trimethylolpropane ethoxylate(meth)acrylate, pentaerythritol tetra(meth)acrylate, pentaerythritol pentaacrylate, pentaerythritol hexa)acrylate, and the like.

Another versatile class of functional monomers and oligomers for use in the disclosed coating are urethane acrylates and methacrylates. In a most basic form, the urethane acrylate is the reaction product of a multifunctional isocyanate with a hydroxyl functional (meth)acrylate. However due to the diversity of the isocyanate and acrylic reactants available, numerous types of ethylenically unsaturated urethane acrylate monomers, oligomers and polymers are commercially available. Some examples are CN994 from Sartomer, Ebecryl 220 from Cytec and Bayhdrol UV2280, an ethylenically unsaturated urethane acrylate polymer from Bayer.

A binder is also included in the coating. The binder is primarily employed for assisting in forming a uniform coating layer, which holds the key components together relatively evenly. Prior to exposure of the coating to radiation, the binder provides low tack and ease of development. After exposure, the binder should impart high adhesion to the substrate, and as a result, high durability on press. Binders may be supplied as solutions, emulsions, or even as solvent-soluble solids. Examples of polymeric binders commonly used in photopolymer printing plates include, without limitation, polyvinylacetals, polyvinylbutyrals, polyesters, cellulosic polymers, epoxies, polystyrenes and copolymers such as syrene-acrylonitrile, and stryrene-maleic anhydride. (Meth)acrylic copolymers are particularly versatile materials due to the diverse number of monomers with which they may be copolymerized. Examples of monomers used to produce (meth)acrylic copolymers include, methyl(meth)acrylate, ethyl(meth)acrylate, (meth)acrylic acid, N-phenylmaleimide, styrene, polyethyleneglycolmethacrylate, (meth)acrylamide and (meth)acrylonitriles, allyl methacrylate, isocyanatoethymethacrylate, and the like. Other useful monomers may be prepared by reacting hydroxyethylmethacrylate with an isocyanate or sulfonylisocyanate, or reacting isocyanatoethymethacrylate with a sulfonamide.

Particularly useful polymers for use in on-press-development processes include those containing pendant poly(alkyleneoxide) groups. Another particularly useful class of polymers is the polyurethane family and derivatives thereof. The majority of polyurethanes are synthesized by reacting at least a multifunctional isocyanate with a polyol. They may also include hybrids and copolymers, such as urethane-urea polymers, urethane-acrylic polymers and urethane-acrylic hybrid polymers.

Compound A

The printing plate coating also includes at least Compound A compound, a silane compound having the structure,

wherein X is a hydrolysable group such as an alkoxy, acyloxy, halogen or amino group, and R is an organic group preferably capable of interacting with the coating via chemical bonding, physical bonding or steric hindrance.

The most common class of silane compounds suitable for incorporation to the photopolymerizable compositions described herein are mono-, bi- and tri-alkoxysilanes such as:

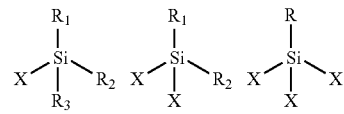

where X is an alkoxy group such as —O—CH$_3$, or —O—CH$_2$CH$_3$, and R$_1$, R$_2$, and R$_3$ are independently organic groups.

Some examples of such materials include, without limitation, acetoxymethyltriethoxysilane, acetoxymethyltrimethoxysilane, acetoxypropyltrimethoxysilane, benzoyloxypropyltrimethoxysilane, (3-acryloxypropyl)trimethoxysilane, methacryloxypropyltrimethoxy-silane, O-(methacryloxyethyl)-n-triethoxysilylpropyl)urethane, methacryloxymethyltrimethoxysilane, methacryloxymethyltriethoxysilane Methacryloxypropyltriethoxysilane, (3-acryloxypropyl)methyldimethoxy silane, (methacryloxymethyl)methyl-dimethoxysilane, (methacryloxymethyl)methyl-diethoxysilane, methacryloxypropylmethyldimethoxysilane, methacryloxypropylmethyldiethoxysilane, methacryloxypropyldimethylmethoxysilane, methacryloxypropyldimethylethoxysilane, triethoxysilylbutyraldehyde, bis(2-hydroxyethyl)-3-aminopropyltriethoxysilane, allyltrimethoxysilane, 3-(n-allylamino)propyltrimethoxysilane, n-(2-aminoethyl)-3-aminopropylmethyldimethoxysilane, n-(2-aminoethyl)-3-aminopropyltrimethoxysilane, 3-aminopropylmethyldiethoxysilane, 3-aminopropyltriethoxysilane, 3-aminopropyltrimethoxysilane, (n-trimethoxysilylpropyl)polyethyleneimine, trimethoxysilylpropyldiethylenetriamine, 4-aminobutyltriethoxysilane, aminophenyltrimethoxysilane, 3-aminopropyltris(methoxyethoxyethoxy)silane, 2-(trimethoxysilylethyl)pyridine, n-(3-trimethoxysilylpropyl)pyrrole, 3-(m-aminophenoxy)propyltrimethoxysilane, 3-aminopropylmethyldiethoxysilane, 3-aminopropyldiisopropylethoxysilane, n-(2-aminoethyl)-3-aminopropyltrimethoxysilane, n-(2-aminoethyl)-3-aminopropyltriethoxysilane, n-(2-aminoethyl)-3-aminopropylmethyldimethoxysilane, (aminoethylamino)-3-isobutyldimethylmethoxysilane, (aminoethylamino)-3-isobutyldimethylmethoxysilane (3-trimethoxysilylpropyl)diethylenetriamine, -butylaminopropyltrimethoxysilane n-ethylaminoisobutyltrimethoxysilane, n-methylaminopropyltrimethoxysilane n-phenylaminopropyltrimethoxysilane, n-phenylaminomethyltriethoxysilane, n-methylaminopropylmethyldimethoxysilane, bis(2-hydroxyethyl)-3-am inopropyltriethoxysilane, diethylaminomethyltriethoxysilane, (n,n-diethyl-3-aminopropyl)trimethoxysilane, 3-(n,n-dimethylaminopropyl)trimethoxysilane n-(3-triethoxysilylpropyl)-4,5-dihydroimidazole, phenyltriethoxysilane, phenyltrimethoxysilane, 6-azidosulfonylhexyltriethoxysilane, 3-chloropropyltrimethoxysilane, 2-(3,4-epoxycyclohexyl)ethyl triethoxysilane, 2-(3,4-epoxycyclohexyl)ethyl trimethoxysilane, (3-glycidoxypropyl)trimethoxysilane, (3-glycidoxypropyl)triethoxysilane, 3-glycidoxypropyl)methyldiethoxy silane, (3-glycidoxypropyl)dimethylethoxysilane, ((chloromethyl)phenylethyl) trimethoxysilane, (p-chloromethyl)phenyltrimethoxysilane chloromethyltriethoxysilane, 3-chloropropyltriethoxysilane, 3-chloropropyltrimethoxysilane, chloromethyltrimethoxysilane, chloromethylmethyldiethoxysilane, 3-chloropropylmethyldimethoxysilane chloromethyldimethylethoxysilane, 3-chloropropyldimethylethoxysilane, bis(2-hydroxyethyl)-3-aminopropyltriethoxysilane, hydroxymethyltriethoxysilane, 2,2-bis(3-triethoxysilylpropoxymethyl)butanol, dodecylsilane, n-octadecylsilane, (tridecafluoro-1,1,2,2-tetrahydrooctyl)silane, 10-undecenylsilane, 3-isocyanatopropyltriethoxysilane (isocyanatomethyl)methyldimethoxysilane, 3-isocyanatopropyltrimethoxysilane tris(3-trimethoxysilylpropyl)isocyanurate, (3-triethoxysilylpropyl)-t-butylcarbamate 3-thiocyanatopropyltriethoxysilane, bis[3-(triethoxysilyl)propyl]tetrasulfide, 3-mercaptopropylmethyldimethoxysilane, 3-mercaptopropyltrimethoxysilane, 2,2-dimethoxy-1-thia-2-silacyclopentane, 2-(4-pyridylethyl)thiopropyltrimethoxysilane, mercaptomethylmethyldiethoxysilane, vinyltriisopropenoxysilane, vinyltriisopropoxysilane, vinyltris(2-methoxyethoxy)silane, vinyltris(methylethylketoximino)silane, (divinylmethylsilylethyl)triethoxysilane, [2-(3-cyclohexenyl)ethyl]trimethoxy silane, styrylethyltrimethoxysilane, vinylmethyldiethoxysilane, vinyldimethylethoxysilane, vinyltriethoxysilane, vinyltrimethoxysilane, allyltrimethoxysilane, vinyltriacetoxysilan.

Alternatively, the $R_1$ and $R_2$ moieties in the relevant structures above may collectively form part of a cyclic structure, such as for example, in a cyclic azasilane:

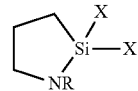

Examples of such suitable materials include, without limitation, n-allyl-aza-2,2-dimethoxysilacyclopentane, n-aminoethyl-aza-2,2,4-trimethylsilacyclopentane, n-(3-aminopropyldimethylsila)aza-2,2-dimethyl-2-silacyclopentane, n-n-butyl-aza-2,2-dimethoxysilacyclopentane 2,2-dimethoxy-1,6-diaza-2-silacyclooctane, n-methyl-aza-2,2,4-trimethylsilacylcopentane.

Alternatively, $R_1$ may be connected to another silane molecule, such as for example in bipodal silanes:

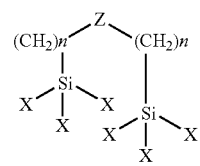

wherein n is an integer from 1 to about 15 and Z is one or more atoms capable of covalently linking the silane groups together.

Examples of such suitable materials include, without limitation, bis(triethoxysilylpropyl)amine, bis(trimethoxysilylpropyl)amine, bis[(3-trimethoxysilyl)propyl]-ethylenediamine, bis[(3-trimethoxysilyl)propyl]-ethylenediamine, bis[3-(triethoxysilyl)propyl]urea, bis(trimethoxysilylpropyl)urea, bis(methyldiethoxysilylpropyl)amine, bis(methyldimethoxysilylpropyl)-n-methylamine, bis(triethoxysilyl)ethane, bis(trimethoxysilyl)ethane, bis(trimethoxysilyl)hexane, bis(trimethoxysilylethyl)benzene bis[(3-methyldimethoxysilyl)propyl polypropylene oxide, bis[3-(triethoxysilyl)propyl]tetrasulfide, bis[3-(triethoxysilyl)propyl]disulfide, bis-[m-(2-triethoxysilylethyl)tolyl]-polysulfide, bis[3-(triethoxysilyl)propyl]thio urea, bis(2-diphenylphosphinoethyl)methylsilylethyltriethoxysilane, bis(triethoxysilylethyl)vinylmethylsilane, bis(triethoxysilyl)ethylene, bis(trimethoxysilylmethyl)ethylene, 1,3-[bis(3-triethoxysilylpropyl)polyethylenoxy]-2-methylenepropane.

The silane compound may alternatively be polymeric, particular examples of which include triethoxysilyl modified poly-1,2-butadiene, trimethoxysilylpropyl modified (polyethylenimine), dimethoxymethylsilylpropyl modified (polyethylenimine, poly(trimethoxysilylpropyl)methacrylate and copolymers thereof, polyvinylmethoxysiloxane, polydimethylsiloxane, polyvinylethoxysiloxane, polyvinylethoxysiloxane-propylethoxysiloxane copolymer, and silsesquioxane derivatives.

Compound B

The coating also includes at least one Compound B compound, a phosphorous oxoacid, or organic derivative thereof, including salts thereof, having one of Formulas I-IV,

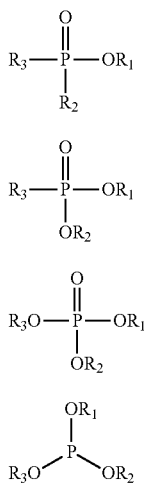

I

II

III

IV

The compound of Formula I is a phosphinic acid; the compound of Formula II is a phosphonic acid; the compound of Formula III is a phosphoric acid; and the compound of Formula IV is a phosphite.

In Formula I, $R_1$ is H, an organic radical, or a silyl radical, while $R_2$ and $R_3$ are independently organic radicals. Examples of such suitable compounds include, without limitation, phosphinic acid, bis(4-methoxyphenyl)phosphonic acid, (2-methoxyphenyl)phenylphosphinic acid, (2-aminophenyl)phenylphosphinic acid, (2-chlorobenyl) phenylphosphinic acid, bis(3-ethoxy-3-oxopropyl)phosphinic acid, bis(hydroxymethyl)phosphinic acid, phenyl (trichloromethyl)phosphinic acid.

In Formula II, $R_1$ and $R_2$ are independently selected from H, an organic radical and a silyl radical, while $R_3$ is an organic radical. Examples of such compounds include, without limitation, phosphonic acid, vinylphosphonic acid, polyvinylphosphonic acid and copolymers thereof, diethyl allylphosphonate, diethyl (methylthiomethyl)phosphonate, (1-aminopropyl)phosphonic acid, amino tri(methylene phosphonic acid), amino tri(methylene phosphonic acid), diethylenetriamine penta(methylene phosphonic acid), bis (hexamethylene triamine penta(methylenephosphonic acid)), 1-hydroxyethylidene-1,1-diphosphonic acid.

In Formula III, $R_1$, $R_2$ and $R_3$ are independently selected from H, an organic radical and a silyl radical. Examples of such compounds include, without limitation, phosphoric acid, diethyl trimethylsilyl phosphate, bis(trimethylsilyl) phosphate, tris(trimethylsilyl)phosphate, mono-, di- and triphosphate esters such as phenyl phosphate mono-n-dodecyl phosphate, hexyl dihydrogen phosphate, creatinol phosphate, bis(2-ethylhexyl)hydrogen phosphate, dihexadecyl phosphate and many commercially available phosphate esters such as Triton QS-44, H-55 and H-66 supplied by Dow Chemical, Dextrol OC-40, OC-50 and OC-60 supplied by Ashland and the Rhodafac line of anionic surfactants supplied by Solvay.

Particularly useful phosphate esters are those which contain an ethylenically unsaturated bond capable of polymerizing with other coating components during exposure to radiation. Examples of such compounds include phosphoric acid 2-hydroxyethyl methacrylate ester, ethylene glycol methacrylate phosphate, Sartomer CD9053 and 9054 supplied by Sartomer, Sipomer PAM-100, 200 and 300 supplied by Cytec, Kayamer PM-2 and Phosmer PE supplied by Uni-Chemical Co. LTD. and Genorad 40 supplied by Rahn USA Corp. Also useful are polyphosphoric condensation products of materials represented by Formula III, including cyclo-triphosphoric acid, pyrophosphoric acid, tripolyphosphoric acid, trimetaphosphoric acid, and tetrapolyphosphoric acid.

In Formula IV, $R_1$ and $R_2$ are independently selected from an organic radical and silyl radical, while $R_3$ is selected from H, an organic radical or silyl radical. Examples of suitable compounds include, without limitation, trimethyl phosphite, dimethylphosphite, triphenyl phosphite, diallylphosphite and tris(trimethylsilyl)phosphite, diethylphosphite, dibenzyl phosphite, bis(2-ethylhexyl)phosphite, and the like.

In addition to the components described above, the disclosed coating may optionally include one or more of numerous other components to provide the plate with further desired properties. For example, surface active anionic, cationic or non-ionic surfactants may be incorporated to improve the film-forming characteristics of the coating layer(s). Polymerization inhibitors such as hydroquinone or 2,6,di-t-butyl-p-cresol may be incorporated to improve storage stability. Colorant dyes and pigments can be incorporated to provide a strong image prior to mounting on press.

Lithographic Printing Plate Preparation Technique

The elements of the photopolymerizable layer are typically applied to the support by dissolving in, and casting from, a suitable solvent system. Suitable organic solvents include 1-methoxy-2-propanol, methyl ethyl ketone, acetone, tetrahyrdofuran, dimethylformamide, 2-methoxy ethanol, methanol, ethanol, gamma-butyrolactone, isopropyl alcohol, n-propanol, and similar solvents. The solvent system may also include a desired amount of water.

A preferred substrate comprises an aluminum support, which has been suitably treated to provide good adhesion of the coating, as well as durability and water-carrying capability on press. Treatments include brush graining, electro graining, chemical graining and anodizing. Further surface treatment may be performed to increase the hydrophilicity of the aluminum support. Such treatments include immersing in a bath of polyvinylphosphonic acid and copolymers thereof, polyacrylic acid and copolymers thereof, or sodium phosphate/sodium fluoride, and the like. Of particular interest is hydrophilisation by treatment with a silicate.

The coating solutions are typically applied to a substrate by methods such as spin coating, spray coating, gravure coating die coating, roller coating and the like. After application of the coating, the solvent is removed to provide a dry photopolymerizable film. Typically the dried polymer film has a coating weight of no more than about 300 mg/ft$^2$.

A high level of sensitivity is typically required in handling the photopolymerizable compositions described herein because the efficacy of free radically induced polymerization can be impacted by the presence of oxygen. Accordingly, an oxygen barrier may be provided over photopolymerizable layer. Typically, such an oxygen-barrier coating is a water-soluble polymer or polymers, cast on top of the photopolymer layer. Examples of materials most useful for their oxygen barrier properties are polyvinyl alcohols, including fully or partially hydrolysed polymers and mixtures thereof. Examples of such materials are Selvol polyvinyl alcohols from Sekisui Chemical and Mowiol polyvinylalcohols from Kuraray America Inc. Such an oxygen-barrier layer would be cast as described above and dried to produce the finished lithographic printing plate precursor. Typically the dried topcoat film has a dry coat weight of no more than about 300 mg/ft$^2$.

The lithographic printing plates disclosed herein are preferably exposed in image areas to incident radiation having a wavelength between 300 and 1200 nm. Exposure may be performed using a graphic arts master film, or preferably, by laser. Any type of laser direct imaging system may be employed including internal drum, external drum and flatbed designs.

After exposure, the plate may be processed conventionally using a suitable developer solution. Because no pre-heat or post-development treatment in the disclosed method, the imaged plates may be developed directly on press using the dampening system to soften the nonimaged (i.e., unreacted) portions of the coating, followed by removal of the nonimaged portions via mechanical action of the ink train and rubber blanket.

As a developing solution for conventional processing, an aqueous alkali solutions having a pH less than 14 is suitable. Commercially available printing plates that have been imaged with violet radiation typically require pre-heating and development at a pH within a range of approximately 12-14. Examples of such solutions include sodium hydroxide, potassium hydroxide, lithium hydroxide sodium carbonate, potassium carbonate, sodium hydrogencarbonate, sodium silicate, sodium metasilicate, sodium borate, potassium borate, monoethanolamine, diethanolamine, triethanolamine, and the like. Unlike many known plates, the disclosed plates can be developed at a pH below 12, such as in a range of approximately 5-12.

Due to environmental and disposal considerations and regulations, developing solutions with a pH as close to neutral (pH7) are typically most desirable. In a preferred form, the developer for processing the inventive plates includes an alcohol having low volatility that is miscible with water, or rendered miscible by the action of a co-solvent or surfactant. The solvent is chosen to efficiently remove the non-imaged (unexposed) areas of the lithographic printing plate precursor, whilst not attacking the imaged (exposed) areas. Preferably, the solvent facilitates high loading capacity, allowing the developer to remove a large volume of coating before replacement is needed. Typically the alcohol constitutes less than 20 percent of the developer by volume, and more typically less than 10 percent. Environmental considerations encourage minimization of the amount of alcohol. Alcohols useful for incorporation into the developing solution include benzyl alcohol, 2-phenoxyethanol, 2-phenylpropanol, 2-benzyloxyethanol, cyclohexanol, and the like.

A surfactant may be included to improve stability of the organic solvent and maintain desired dissolution characteristics of the developing solution. Typically the surfactant constitutes less than about 20 percent of the developer by volume and most typically less than about 10 percent by volume. Examples of suitable surfactants include sodium dodecyl sulfate, potassium dodecyl sulfate, ammonium dodecyl sulfate, sodium stearate, dioctyl sulfosuccinate, sodium dodecylbenzenesulfonate, sodium alkyl naphthalene sulfonates, (Poly(oxy-1,2-ethanediyl),a-2-naphthalenyl-w-hydroxy-), alkyldiphenyloxide sulfonates, and the like. The developer may also contain additional constituents such as antifoamers and hard water softeners, such as ethylenediaminetetraacetic acid.

The exposed printing plates may be developed in a suitable processor. In a most typical configuration, the processor will comprise a pre-wash tank to remove the topcoat, a development section to remove the unexposed photosensitive coating, a rinse section and a gum section. Development may be carried out by spraying or immersing the coating in the developing solution. Typically, the developer tank includes brushes or molleton rollers to aid the removal of unwanted coating.

Gum may be applied to preserve the lithographic qualities of the printing plate before it is mounted on press. Typically the gum consists of gum arabic, cellulose derivatives, polymers containing sulfonic groups, polymers containing phosphonic acid groups, anionic surfactants, and the like. Preferably the gum solution is ostensibly free of organic solvents.

In a preferred embodiment, the separate pre-wash step is eliminated from the above-described process. The process may be further simplified by developing and gumming in a single processing solution, thereby allowing processing of the plate in a single tank environment. It may be possible to conduct such a process in either developer or gum provided that the processing solution is capable of removing unwanted areas of coating, and preserving the lithographic properties prior to mounting on press.

Illustrative Examples

The herein disclosed coating and process may be further illustrated by the herein non-limiting working examples, which follow the glossary immediately below:

O-Cl-HABI: 2.2'-bis(2-chlorophenyl)-4,4',5,5'-tetraphenyl 1,1'-biimidazole, CAS7189-82-4, available from Charkit Chemical Corporation, Norwalk, Conn.

2-mercaptobenzothiazole: available from Sigma-Aldrich, Milwaukee, Wis.

S0917: 1,1,6,6,8-Pentamethyl-2,3,5,6-tetrahydro-1H,4H-11-oxa-3a-aza-benzo[de]anthracen-10-one, a coumarin dye with the following structure, available from FEW chemicals GmbH, Bitterfeld-Wolfen, Germany:

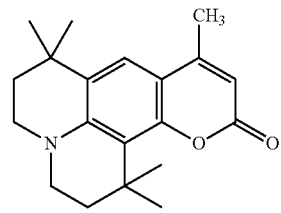 [SMILES: Cc1cc(=O)oc2c3c4c(cc12)C(C)(C)CCN4CCC3(C)C]

Cyclomer Z250: A 45% by weight solution of acrylic resin in dipropylene glycol methyl ether, supplied by Allnex USA Inc, Smyrna, Ga.

29S1657: A pigment dispersion comprising phthalocyanine blue 15-4, (59.5 parts), Cyclomer Z250, (87.8 parts), BYK344 (1 part), 1-methoxy-2-propanol, (251.7 parts), prepared by Penn Color, Doylestown, Pa.

Neorez 1391: An aliphatic polyurethane polymer available from DSM, Heerlen, Netherlands.

BYK 344: A silicone surface additive, supplied by BYK USA Inc, Wallingford, Conn.

Ebecryl 1290: a hexafunctional aliphatic urethane acrylate, available from Allnex USA Inc, Smyrna, Ga.

Selvol 107: A 10% by weight solution of polyvinylalcolhol in water, as supplied by Sekisui America, Mount Laurel, N.J.

Selvol 205: A 21% by weight solution of polyvinylalcolhol in water, as supplied by Sekisui America, Mount Laurel, N.J.

Capstone FS-30: A 25% solution by weight of an ethoxylated nonionic fluorosurfactant in water, as supplied by DuPont, Wilmington, Del.

(3-mercaptopropyl)trimethoxysilane: available from Sigma-Aldrich, Milwaukee, Wis.

(3-glycidyloxypropyl)trimethoxysilane: available from Sigma-Aldrich, Milwaukee, Wis.

3-(trimethoxysilylpropyl)acrylate: available from Sigma-Aldrich, Milwaukee, Wis.

3-(trimethoxysilylpropyl)methacrylate: available from Sigma-Aldrich, Milwaukee, Wis.

Genosil GF31: 3-(trimethoxysilylpropyl)methacrylate, available from Wacker Chemie AG, Munich, Germany.

Genosil XL10: Vinyltrimethoxysilane, available from Wacker Chemie AG, Munich, Germany.

SIB1820.0: 1,2-bis(triethoxysilyl)ethylene, available from Gelest, Morrisville, Pa.

SID1932.4: N-n-butyl-aza-2,2-dimethoxysilacyclopentane, available from Gelest, Morrisville, Pa.

Sartomer CD9054: a trifunctional phosphate ester of 2-hydroxyethyl methacrylate, available from Sartomer, Exton, Pa.

Genorad 40: a methacrylated phosphate ester, available from Rahn USA, Aurora, Ill.

Sipomer PAM300: an acrylated phosphate ester, available from, Rhodia, Cranberry, N.J.

Phosphoric acid 2-hydroxyethyl methacrylate ester: available from Sigma Aldrich, Milwaukee, Wis.

Vinylphosphonic acid: available from Sigma Aldrich, Milwaukee, Wis.

Tris(trimethylsilyl)phosphite: available from Sigma Aldrich, Milwaukee, Wis.

Triton QS44: a polyether phosphate ester, available from Dow Chemical Company, Midland, Mich.

Dequest 2000: Amino tri (methylene phosphonic acid), available from Brenntag Northeast Inc, Reading, Pa.

Polyvinylphosphonic acid, available from Charkit Chemical Corporation, Norwalk, Conn.

Substrate A: 0.012"×12'×19' aluminum sheet that has been brush grained, electro-grained, anodized and post-treated with sodium metasilicate.

N200 developer: A conventional subtractive developer consisting water, benzyl alcohol and sodium alkyl naphthalene sulfonate, as supplied by Anocoil Corporation, Rockville, Conn.

Anocoil WN finisher: A gum solution consisting water, gum arabic and amino tri(methylene phosphonic acid), pentasodium salt, as supplied by Anocoil Corporation, Rockville, Conn.

Protek XPH85: A conventional plate processor containing a developer spray tank equipped with two brushes, a rinse tank, and a gum tank, as supplied by Protek, Sholinganallur, India.

ECRM Mako 4: A violet computer-to-plate setter with a laser output at 405 nm, as supplied by ECRM Imaging Systems, Tewksbury, Mass.

ICPlateII plate reader: as supplied by X-Rite, Grand Rapids, Mich.

Sutherland rub tester; as supplied by Danilee Company, San Antonio, Tex.

Tables A-D below show the identities of components used throughout the examples that follow, and which are summarized in Table E.

TABLE A

Compound A - Silane Compound (Stock Solutions)

| | | |
|---|---|---|
| A1 | Genosil GF31, 5.65 parts | methanol, 94.35 parts |
| A2 | Genosil XL10, 5.65 parts | methanol, 94.35 parts |

TABLE A-continued

Compound A - Silane Compound (Stock Solutions)

| | | |
|---|---|---|
| A3 | (3-mercaptopropyl)trimethoxysilane, 5.65 parts | methanol, 94.35 parts |
| A4 | (3-glycidyloxypropyl)trimethoxysilane, 5.65 parts | methanol, 94.35 parts |
| A5 | 3-(trimethoxysilylpropyl)acrylate, 5.65 parts | methanol, 94.35 parts |
| A6 | 3-(trimethoxysilylpropyl)methacrylate, 5.65 parts | methanol, 94.35 parts |
| A7 | SIB1820.0, 5.65 parts | methanol, 94.35 parts |
| A8 | SID1932.4, 5.65 parts | methanol, 94.35 parts |

TABLE B

Compound B - Phosphorous Oxoacid (Stock Solutions)

| | | |
|---|---|---|
| B1 | Sipomer PAM300, 5.65 parts | methanol, 94.35 parts |
| B2 | CD9054, 5.65 parts | methanol, 94.35 parts |
| B3 | Genorad 40, 5.65 parts | methanol, 94.35 parts |
| B4 | Phosphoric acid 2-hydroxyethyl methacrylate ester, 5.65 parts | methanol, 94.35 parts |
| B5 | Triton QS44, 5.65 parts | methanol, 94.35 parts |
| B6 | Dequest 2000, 5.65 parts | methanol, 94.35 parts |
| B7 | polyvinylphosphonic acid, 5.65 parts | methanol, 94.35 parts |
| B8 | vinylphosphonic acid, 5.65 parts | methanol, 94.35 parts |
| B9 | Trimethylsilylphosphite, 5.65 parts | methanol, 94.35 parts |

TABLE C

Base Photosensitive Coating Solution

| Component | Coating Solution X amount (g) |
|---|---|
| 1-methoxy-2-propanol | 57.753 |
| 2-butanone | 30.377 |
| Dimethylformamide | 4.34 |
| o-cl-HABI | 0.115 |
| 2-mercaptobenzothiazole | 0.115 |
| S0917 | 0.187 |
| Neorez 1391 | 3.29 |
| 29S1657 | 0.476 |
| Ebecryl 220 | 3.314 |
| BYK344 | 0.033 |

TABLE D

Topcoat Solution

| Component | Topcoat solution amount (g) |
|---|---|
| Selvol 107 | 122.5 |
| Selvol 205 | 59.52 |
| FS-30 | 1 |
| propan-2-ol | 20 |
| water | 296.98 |

TABLE E

Photosensitive Coating Formulations

| Example | photosensitive coating | Compound A | Compound B |
|---|---|---|---|
| C1 | coating X 100 parts | — | — |
| C2 | coating X 99 parts | Compound A1 1 part | — |

TABLE E-continued

Photosensitive Coating Formulations

| Example | photosensitive coating | Compound A | Compound B |
|---|---|---|---|
| C3 | coating X 98 parts | Compound A1 2 parts | — |
| C4 | coating X 96 parts | Compound A1 4 parts | — |
| C5 | coating X 94 parts | Compound A1 6 parts | — |
| C6 | coating X 92 parts | Compound A1 8 parts | — |
| C7 | coating X 99 parts | — | Compound B1 1 part |
| C8 | coating X 98 parts | — | Compound B1 2 parts |
| C9 | coating X 96 parts | — | Compound B1 4 parts |
| C10 | coating X 94 parts | — | Compound B1 6 parts |
| C11 | coating X 92 parts | — | Compound B1 8 parts |
| 12 | coating X 94 parts | Compound A1 1 part | Compound B1 5 parts |
| 13 | coating X 94 parts | Compound A2 1 part | Compound B1 5 parts |
| 14 | coating X 94 parts | Compound A3 1 part | Compound B1 5 parts |
| 15 | coating X 94 parts | Compound A4 1 part | Compound B1 5 parts |
| 16 | coating X 94 parts | Compound A5 1 part | Compound B1 5 parts |
| 17 | coating X 94 parts | Compound A6 1 part | Compound B1 5 parts |
| 18 | coating X 94 parts | Compound A7 1 part | Compound B1 5 parts |
| 19 | coating X 94 parts | Compound A8 1 part | Compound B1 5 parts |
| 20 | coating X 94 parts | Compound A1 1 part | Compound B2 5 parts |
| 21 | coating X 94 parts | Compound A1 1 part | Compound B3 5 parts |
| 22 | coating X 94 parts | Compound A1 1 part | Compound B4 5 parts |
| 23 | coating X 94 parts | Compound A1 1 part | Compound B5 5 parts |
| 24 | coating X 94 parts | Compound A1 1 part | Compound B6 5 parts |
| 25 | coating X 94 parts | Compound A1 1 part | Compound B7 5 parts |
| 26 | coating X 94 parts | Compound A1 1 part | Compound B8 5 parts |
| 27 | coating X 94 parts | Compound A1 1 part | Compound B9 5 parts |
| 28 | coating X 94 parts | Compound A3 1 part | Compound B5 5 parts |
| 29 | coating X 94 parts | Compound A3 1 part | Compound B6 5 parts |
| 30 | coating X 94 parts | Compound A4 1 part | Compound B5 5 parts |
| 31 | coating X 94 parts | Compound A4 1 part | Compound B6 5 parts |

The photosensitive coating in each example was applied to Substrate A with a 0.008" wire wound bar, followed by drying in an oven at 80° C. for 120 seconds. A topcoat solution was applied to each photosensitive coating with a 0.012" wire-wound bar, followed by drying for 120 seconds at 80° C.

Test Conditions

1. Developer Rub Test

The following described developer rub test was performed using laser exposures of 45 and 70 microjoules per square centimeter. The printing plate precursors were exposed with a halftone screen using a Mako 4 platesetter. The precursors were developed at a transport speed of 5 feet per minute through a Protek XPH processor filled with Anocoil N200 developer without pre-heating. The dot value of the halftone screen was thereafter measured using an ICPlatell plate reader.

A Prematek flat cloth supplied by CCP Industries, Cleveland Ohio, was then impregnated with Anocoil N200 developer. The halftone image on the plate was given 60 hard rubs with the developer soaked cloth. After rubbing, the plate was rinsed with water and another dot value reading was taken using the same method as described above. The amount of dot loss sustained during the developer rub was calculated by subtracting the second reading from the first reading.

Plates were given a ranking of 1 to 10 based on the amount of halftone dot lost during the developer rub. Less than 10% dot removal resulted in a ranking of 1, less than 20% a value of 2 and so on, with 10 being the worst score indicating 100% dot removal. A value greater than 2 is generally considered insufficient for offset lithographic printing in practice.

2. Sutherland Rub Test

The Sutherland rub test was performed using laser exposures of 45 and 70 microjoules per square centimeter. The printing plate precursors were exposed with a halftone screen using a Mako 4 platesetter. The precursors were developed at a transport speed of 5 feet per minute though a Protek XP processor filled with Anocoil N200 developer without pre-heating.

A felt pad was impregnated with Arrowlith magenta ink and Prisco 3451 fountain solution diluted to 4 oz. per gallon of water, as supplied by FlintGroup, Plymouth Mich., and Prisco, Hingham Mass., respectively. The felt pad was attached to the Sutherland rub tester's 4 pound weighted arm. The ink and fountain solution were rubbed into the plate surface for 1000 cycles at a speed of approximately 40 cycles per minute. After rubbing, the plates were cleaned with fountain solution and the image was thereafter inspected under magnification for signs of coating attrition.

Plates were given a ranking of 1 to 10 based on the amount of coating removed due to adhesion failure. Less than 10% coating removal resulted in a ranking of 1, less than 20% a value of 2 and so on, with 10 being the worst score indicating 100% coating removal. A score greater than 3 is generally considered insufficient for offset lithographic printing in practice.

3. Press Test

The press test was performed using laser exposure of 45 microjoules per square centimeter. The printing plate precursors were exposed with a test pattern using a Mako 4 platesetter. The precursors were developed at a transport speed of 5 feet per minute through a Protek XPH processor filled with Anocoil N200 developer and Anocoil VVT gum without pre-heating. The imaged plates were mounted on an Hamada 800 DS printing press using 5 ounces per gallon of water of Prisco 2451 plus 2G fountain solution and VanSon CML oil base plus black ink.

Results

TABLE F

Comparative Examples 1-11

| Example | Developer rub test | | Sutherland rub test | |
|---|---|---|---|---|
| | 45 microjoules | 70 microjoules | 45 microjoules | 70 microjoules |
| C1 | 10 | 10 | 9 | 9 |
| C2 | 10 | 7 | 8 | 8 |

TABLE F-continued

Comparative Examples 1-11

| | Developer rub test | | Sutherland rub test | |
| --- | --- | --- | --- | --- |
| Example | 45 microjoules | 70 microjoules | 45 microjoules | 70 microjoules |
| C3 | 7 | 6 | 6 | 4 |
| C4 | 10 | 10 | 9 | 9 |
| C5 | 10 | 10 | 9 | 9 |
| C6 | 10 | 10 | 9 | 9 |
| C7 | 9 | 8 | 8 | 8 |
| C8 | 8 | 7 | 7 | 5 |
| C9 | 7 | 6 | 6 | 4 |
| C10 | 5 | 3 | 5 | 4 |
| C11 | 5 | 3 | 5 | 4 |

Comparative Example C1 demonstrates that when neither compounds A or B are present, the printing plate precursor does not produce a printing plate that is durable enough for lithographic printing.

Comparative Examples C2-C6 demonstrate that it is not possible to achieve printing durability through incorporation of Compound A1 only.

Examples C7-C11 demonstrate that it is not possible to achieve printing durability through incorporation of Compound B1 only.

In sum, neither Compound A1 nor B1 alone is capable of producing a durable image sufficient for lithographic printing.

TABLE G

Examples 12-19

| | Developer rub test | | Sutherland rub test | |
| --- | --- | --- | --- | --- |
| Example | 45 microjoules | 70 microjoules | 45 microjoules | 70 microjoules |
| 12 | 1 | 1 | 1 | 1 |
| 13 | 2 | 2 | 2 | 2 |
| 14 | 2 | 1 | 1 | 2 |
| 15 | 1 | 1 | 1 | 1 |
| 16 | 1 | 1 | 1 | 1 |
| 17 | 2 | 2 | 2 | 1 |
| 18 | 1 | 1 | 1 | 1 |
| 19 | 1 | 1 | 1 | 1 |

With reference to Table G above, Example 12 is effectively a mixture of Comparative Examples C5 and C10 at a ratio of 1:5. The Example 12 formulation easily passes all durability tests, confirming that when combined, the coatings of Comparative Examples C5 and C10 (i.e., with both Compounds A1 and B1) produce a synergistic effect which substantially increases coating adhesion in the resulting plate.

Altogether, Examples 12-19 demonstrate that the synergistic effect between Compounds A and B is present when varying functional groups attached to Compound A, each such Example producing a printing plate with a high level of durability.

TABLE H

Examples 20-27

| | Developer rub test | | Sutherland rub test | |
| --- | --- | --- | --- | --- |
| Example | 45 microjoules | 70 microjoules | 45 microjoules | 70 microjoules |
| 20 | 2 | 1 | 2 | 1 |
| 21 | 1 | 1 | 1 | 1 |
| 22 | 1 | 1 | 1 | 1 |
| 23 | 2 | 1 | 3 | 2 |
| 24 | 2 | 1 | 3 | 2 |
| 25 | 2 | 1 | 2 | 3 |
| 26 | 2 | 2 | 3 | 2 |
| 27 | 3 | 2 | 3 | 2 |

Examples 20-27 demonstrate that it is possible to produce a plate with acceptable durability when using a variety of phosphorous oxoacids and derivatives (Compound B), including monofunctional, multifunctional and polyfunctional materials.

TABLE I

Examples 28-31.

| | Developer rub test | | Sutherland rub test | |
| --- | --- | --- | --- | --- |
| Example | 45 microjoules | 70 microjoules | 45 microjoules | 70 microjoules |
| 28 | 1 | 1 | 1 | 1 |
| 29 | 1 | 1 | 1 | 1 |
| 30 | 1 | 1 | 1 | 1 |
| 31 | 1 | 1 | 1 | 1 |

The majority of individual compounds known to promote adhesion of lithographic coatings include a functional group capable of interacting with the substrate, and an ethylenically unsaturated group capable of taking part in the photopolymerization process. Indeed, each of Example C2 through Example 27 includes an ethylenically unsaturated group present on Compound A, Compound B, or both. However, an ethylenically unsaturated group is absent from each of Compounds A and Compounds B used in Examples 28-31, yet the respective combinations still produce a coating that strongly bonds with the substrate, further establishing the unexpected synergistic interaction between the silane and phosphorus oxoacid compounds, and the resulting durable printing plate.

Example 32

In Example 32, the printing plate from Comparative Example C5 was subjected to a press test. The test was stopped at 1000 impressions due to poor print quality. The plate was removed and cleaned with fountain solution. Inspection revealed that the image had suffered adhesion failure.

Example 33

In Example 33, the printing plate from Comparative Example C10 was subject to a press test. The test was stopped at 5000 impressions due to poor print quality. The plate was removed and cleaned with fountain solution. Inspection revealed that the image had suffered adhesion failure.

Example 34

The printing plate from Example 12 was subject to a press test. The test was stopped at 30000 impressions and the quality of prints was still excellent. The plate was removed and cleaned with fountain solution. Inspection revealed that the image exhibited no noticeable damage whatsoever. Since coating 12 is a blend of coating C5 (1 part) and C10 (5 parts), it is clear that, when combined in a plate coating, Compounds A and B undergo a serendipitous interaction which yields a printing plate with excellent on-press durability.

Example 35

In Example 35, the printing plate from Example 28 was subject to a press test. The test was stopped at 30000 impressions and the quality of prints was still excellent. The plate was removed and cleaned with fountain solution. Inspection revealed the image had suffered no damage whatsoever.

The foregoing tests indicate that commercially acceptable printing plates for lengthy press runs, even runs of over 100,000 impressions, can be produced with violet imaging and without a pre-heat step prior to a post-treatment step after development, using the coatings, precursors and associated method described herein. The method comprises the steps of selecting a plate precursor in which a photopolymerizable oliophilic coating is adhered to a hydrophilic substrate; image wise exposing the coating to violet radiation and thereby producing a pattern of photopolymerized image areas and nonimage areas not affected by the radiation; without preheating the plate, developing the plate in an alkaline solution to remove all or substantially all of the nonimage areas from the substrate while the image areas substantially remain on the substrate; and without post-treatment, mounting the developed plate in a lithographic printing press. The imaging is preferably with radiation exposure in the range of about 45-70 microjoules/cm$^2$ and the plate is developed in an aqueous solution at a pH less than 12, preferably in an alkaline solution at a pH no greater than about 10.

While a preferred embodiment has been set forth for purposes of illustration, the foregoing description should not be deemed a limitation of the invention herein. Accordingly, various modifications, adaptations and alternatives may occur to one skilled in the art without departing from the spirit of the invention and scope of the claimed coverage.

The invention claimed is:

1. A coating composition for use on a hydrophilic sheet substrate to form a lithographic printing plate precursor, comprising:
   (a) an initiator component capable of generating free radicals;
   (b) a free radically polymerizable component;
   (c) a polymeric binder component;
   (d) a Compound A component including one or more silane compounds of the structure $R_n SiX_{(4-n)}$, wherein X comprises at least one hydrolysable group, R comprises at least one organic group, and n is an integer between 0 and 4; and
   (e) a non-polymeric phosphate ester.

2. The coating composition of claim 1, wherein the Compound A component is an organic silane having the structure

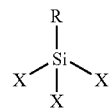

wherein each X is independently selected from a hydroxy and alkoxy group, and R is an organic group, and the non-polymeric phosphate ester has the structure

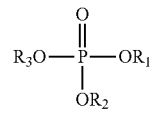

wherein $R_1$, $R_2$ and $R_3$ are independently selected from H, an organic radical and a silyl radical.

3. The coating composition of claim 1, wherein the Compound A component is selected from one or more of (3-mercaptopropyl)trimethoxysilane, (3-glycidyloxypropyl)trimethoxysilane, or 3-(trimethoxysilylpropyl)acrylate, 3-(trimethoxysilylpropyl)methacrylate.

4. The coating composition of claim 3, wherein the non-polymeric phosphate ester component contains an ethylenically unsaturated bond capable of taking part in the photopolymerization process.

5. A method for producing a lithographic printing plate, comprising:
   (a) selecting a plate having a photopolymerizable oleophilic coating adhered to a hydrophilic substrate, the coating having
      (i) a first component comprising one or more silane compounds of the structure $R_n SiX_{(4-n)}$, wherein X is at least one hydrolysable group, and R is at least one organic group, and
      (ii) a second component comprising a non-polymeric phosphate ester;
   (b) imagewise exposing the coating to violet radiation to produce a pattern of photopolymerized image areas and nonimage areas not affected by the radiation;
   (c) without preheating the plate above ambient temperature, developing the plate in an alkaline solution to remove nonimage areas of the coating from the substrate while retaining the image areas on the substrate; and
   (d) without further radiation treatment of the plate, mounting the developed plate on a lithographic printing press.

6. The method of claim 5, wherein the coating comprises:
   (a) an initiator component capable of generating free radicals;
   (b) a free radically polymerizable component; and
   (c) a polymeric binder component.

7. The method of claim 5, wherein the step of developing is performed with the plate in a single tank which includes the alkaline solution and a gum.

8. The method of claim 5, wherein the imagewise exposure is with radiation within the range of 45 to 70 microjoules/cm$^2$.

9. The method of claim 5, wherein the step of developing is performed in an aqueous alkaline solution having a pH below 12.

10. The method of claim 5, wherein the step of developing is performed in an aqueous alkaline solution having a pH no greater than 10.

11. A lithographic printing plate precursor, comprising:

(a) a hydrophilic substrate sheet defining a first surface; and (b) a violet polymerizable coating non-ionically adhered to the substrate first surface, comprising:

(i) a first component including one or more silane compounds of the structure $R_nSiX_{(4-n)}$, wherein X comprises at least one hydrolysable group, R comprises at least one organic group, and n is an integer between 0 and 4, and (ii) a second component including a non-polymeric phosphate ester.

12. The lithographic printing plate precursor of claim 11, wherein the polymerizable coating comprises:

(iii) an initiator composition component capable of generating free radicals;

(iv) a free radically polymerizable component; and (v) a polymeric binder component.

13. The method of claim 5, wherein the silane compound is an organic silane having the structure

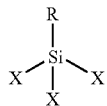

wherein each X is independently selected from a hydroxy and alkoxy group, and R is an organic group, and the non-polymeric phosphate ester has the structure

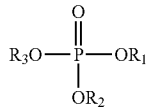

wherein $R_1$, $R_2$ and $R_3$ are independently selected from H, an organic radical and a silyl radical.

14. The coating composition of claim 3, wherein the non-polymeric phosphate ester component is an acrylated phosphate ester.

* * * * *